(12) United States Patent
Chung

(10) Patent No.: US 10,128,260 B2
(45) Date of Patent: Nov. 13, 2018

(54) SEMICONDUCTOR DEVICE

(71) Applicant: SK hynix Inc., Gyeonggi-do (KR)

(72) Inventor: Sung Jae Chung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 15/202,303

(22) Filed: Jul. 5, 2016

(65) Prior Publication Data

US 2017/0221919 A1   Aug. 3, 2017

(30) Foreign Application Priority Data

Feb. 1, 2016 (KR) ........................ 10-2016-0012484

(51) Int. Cl.
| | | |
|---|---|---|
| *H01L 27/115* | (2017.01) | |
| *H01L 27/11575* | (2017.01) | |
| *H01L 27/11524* | (2017.01) | |
| *H01L 27/11526* | (2017.01) | |
| *H01L 27/11556* | (2017.01) | |
| *H01L 27/11548* | (2017.01) | |
| *H01L 27/1157* | (2017.01) | |
| *H01L 27/11573* | (2017.01) | |
| *H01L 27/11582* | (2017.01) | |

(52) U.S. Cl.
CPC .... *H01L 27/11575* (2013.01); *H01L 27/1157* (2013.01); *H01L 27/11524* (2013.01); *H01L 27/11526* (2013.01); *H01L 27/11548* (2013.01); *H01L 27/11556* (2013.01); *H01L 27/11573* (2013.01); *H01L 27/11582* (2013.01)

(58) Field of Classification Search
CPC ......... H01L 27/11551; H01L 27/11553; H01L 27/11556; H01L 27/11578; H01L 27/1158; H01L 27/11582; H01L 27/11597; H01L 29/66666; H01L 27/068; H01L 27/11548
See application file for complete search history.

(56) References Cited

U.S. PATENT DOCUMENTS

| | | | | |
|---|---|---|---|---|
| 9,449,986 B1* | 9/2016 | Yoon | ................. | H01L 27/11582 |
| 2009/0242967 A1 | 10/2009 | Katsumata et al. | | |
| 2012/0208347 A1* | 8/2012 | Hwang | ............... | H01L 27/1157 438/430 |
| 2014/0175534 A1* | 6/2014 | Kofuji | ............... | H01L 27/11575 257/324 |
| 2015/0303214 A1* | 10/2015 | Kim | ................. | H01L 27/11582 257/329 |
| 2016/0225785 A1* | 8/2016 | Kim | ................. | H01L 27/11575 |

FOREIGN PATENT DOCUMENTS

KR   1020120066331   6/2012

* cited by examiner

*Primary Examiner* — Matthew Reames
*Assistant Examiner* — John Bodnar
(74) *Attorney, Agent, or Firm* — IP & T Group LLP

(57) ABSTRACT

A semiconductor device includes a substrate including a cell region and a peripheral region adjacent to the cell region, a cell stack structure located in the cell region, the cell stack structure including vertical memory strings, a circuit located in the peripheral region, the circuit driving the vertical memory strings, and an interlayer insulating layer formed on the substrate to cover the cell stack structure and the circuit, and including air gaps located between the cell region and the peripheral region.

18 Claims, 12 Drawing Sheets

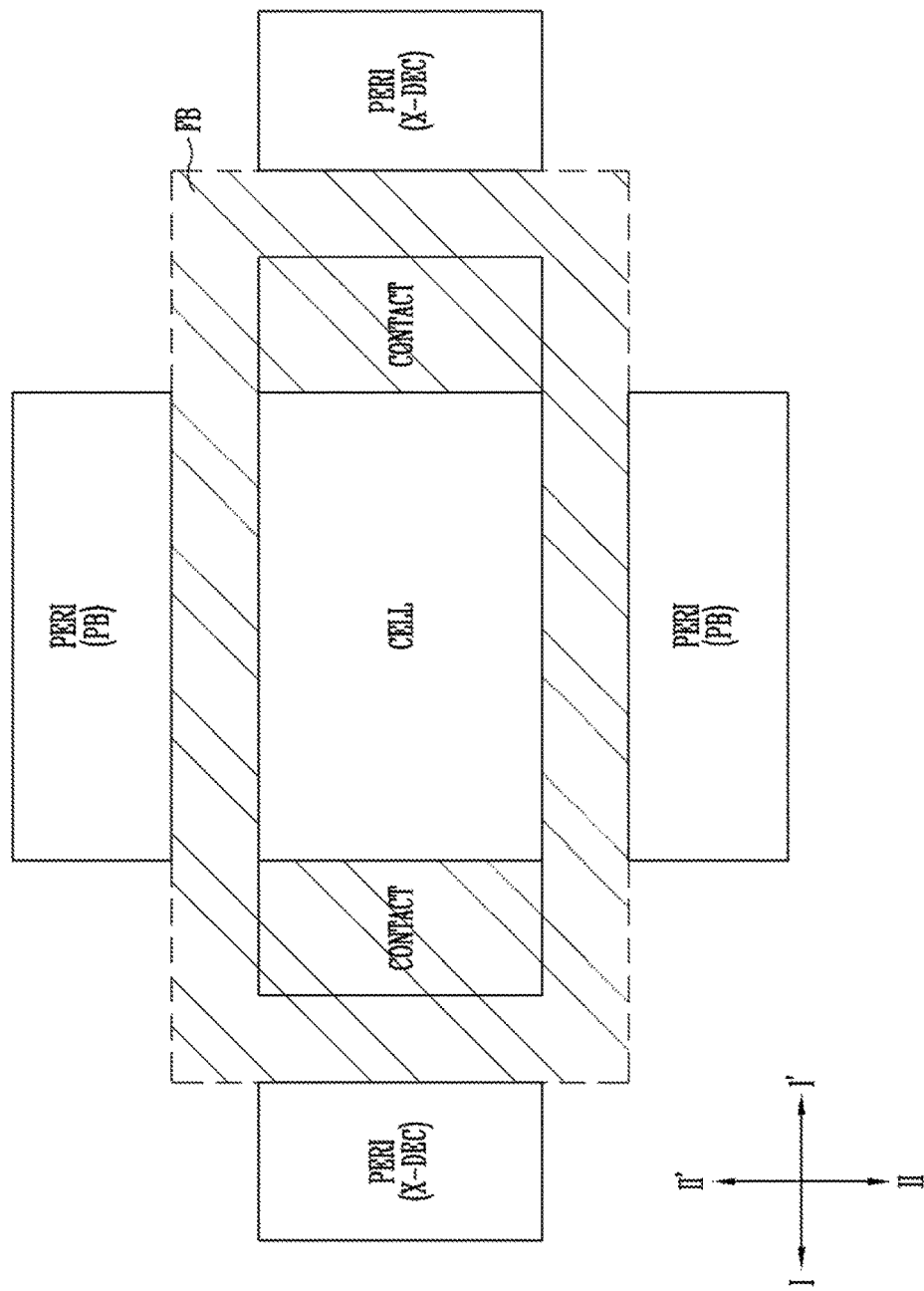

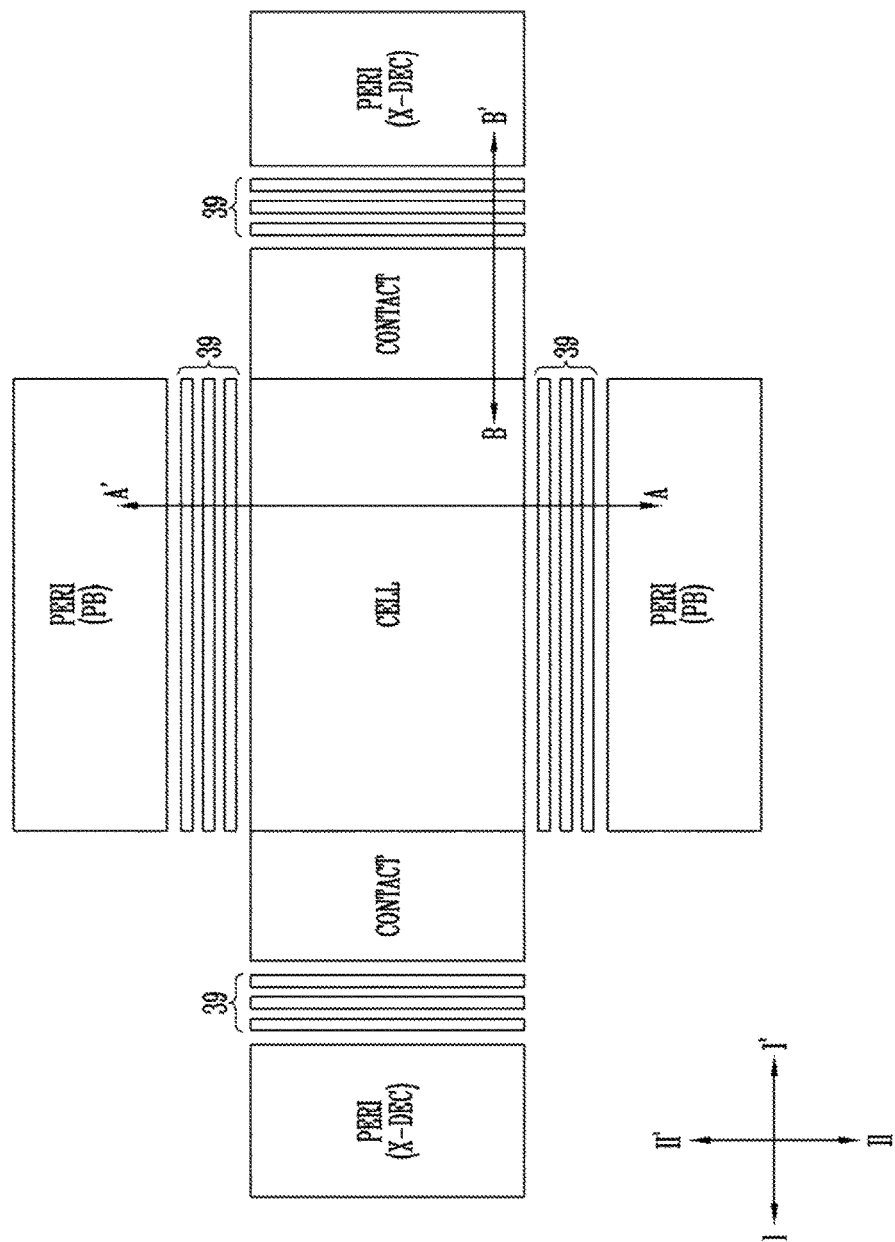

SEMICONDUCTOR DEVICE

CROSS-REFERENCE TO RELATED APPLICATION

The present application claims priority under 35 U.S.C 119(a) to Korean patent application number 10-2016-0012484 filed on Feb. 1, 2016, in the Korean Intellectual Property Office, the entire disclosure of which is incorporated herein in its entirety by reference.

BACKGROUND

1. Field

An aspect of the present disclosure relates to an electronic device and, more particularly, to a semiconductor device having a three-dimensional structure and a manufacturing method thereof.

2. Description of the Related Art

Nonvolatile memory devices are memory devices which retain stored data even when a power supply to the device is cut off. Recently, as further improvements in the degree of integration of two-dimensional nonvolatile memory devices in which memory cells are formed in a single layer over a silicon substrate have become very difficult, there has been proposed a three-dimensional nonvolatile memory device in which memory cells are vertically stacked on a silicon substrate.

Generally, a structure of a three-dimensional nonvolatile memory device includes a plurality of conductive layers and insulating layers which are alternately stacked on a silicon substrate to form multiple, stacked layers of memory cells. Generally, as the height of a stack structure increases so does also the degree of integration of the memory device. However, as the height of the stack structure increases, the stress applied to the stack structure also increases. Accordingly, as a result of the stress, the geometry of the stack structure may change. Therefore, performance of three dimensional memory devices may suffer as the height of the stack structure increases.

SUMMARY

Embodiments of the present invention provide a three dimensional semiconductor device having an enhanced stable structure, and a high yield manufacturing method thereof.

According to an aspect of the present disclosure, there is provided a semiconductor device including: a substrate including a cell region and a peripheral region adjacent to the cell region; a cell stack structure located in the cell region, the cell stack structure including vertical memory strings; a circuit located in the peripheral region, the circuit driving the vertical memory strings; and an interlayer insulating layer formed on the substrate to cover the cell stack structure and the circuit, and including air gaps located between the cell region and the peripheral region.

According to an aspect of the present disclosure, there is provided a semiconductor device including: a substrate; a stack structure formed over the substrate; an interlayer insulating layer formed on the substrate to cover the stack structure; and a flexible buffer located at the periphery of the stack structure, and formed in the interlayer insulating layer to buffer stress applied to the stack structure from the interlayer insulating layer.

According to an aspect of the present disclosure, there is provided a method of manufacturing a semiconductor device, the method including: forming a cell stack structure in a cell region of a substrate; forming a transistor in a peripheral region of the substrate; forming, on the substrate, an interlayer insulating layer covering the cell stack structure and the transistor; forming, in the interlayer insulating layer, at least one opening located between the cell region and the peripheral region; and forming an air gap located in the opening by sealing the top of the opening using a first insulating layer.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a layout Illustrating a structure of a semiconductor device, according to an embodiment of the present disclosure.

FIG. 3 is a layout of a semiconductor device according to an embodiment of the present disclosure.

DETAILED DESCRIPTION

Figure 2A:
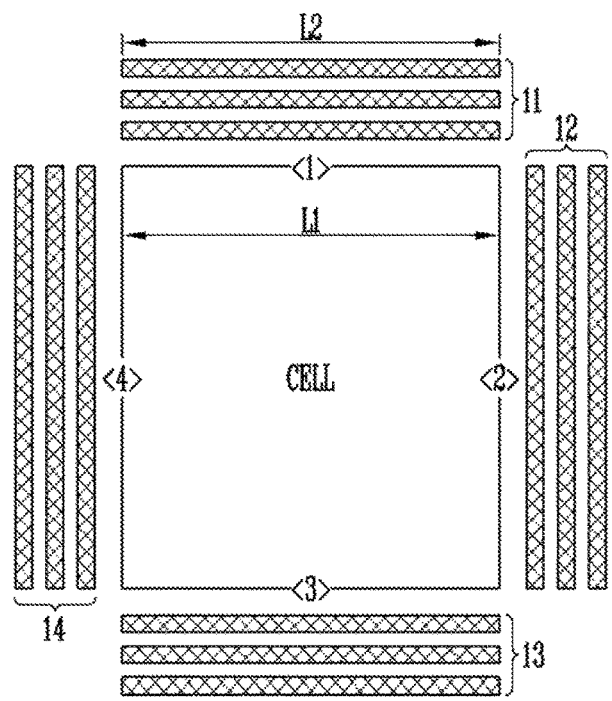
FIGS. 2A to 2D are layouts illustrating arrangement forms of flexible buffers, according to embodiments of the present disclosure.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

FIG. 1 is a layout Illustrating a structure of a semiconductor device, according to an embodiment of the present disclosure.

Referring to FIG. 1, the semiconductor memory device, includes a cell region CELL and a peripheral region PERI adjacent to the cell region CELL. The cell region CELL is a region in which a cell stack structure including memory strings is located. The memory strings may include memory cells stacked on a substrate, and may be arranged in a shape protruding from a surface of the substrate in a vertical, substantially vertical or an incline orientation. For example, the memory strings may be arranged in a straight shape, a U shape, a W shape, or the like.

The peripheral region PERI is a region in which a circuit for driving the vertical memory strings is located. For example, the circuit in the peripheral region PERI may be or include a transistor, a register, a capacitor, and the like. As illustrated in FIG. 1, The peripheral region PERI may include a page buffer region PB, and an X-decoder region X-DEC.

A contact region CONTACT may be located between the cell region CELL and the peripheral region PERI. In the Illustrated embodiment of FIG. 1, the contact region is located only between the X-decoder region of the peripheral region PERI and the cell region CELL, in a first direction I-I' direction. The contact region CONTACT is a region in which a pad stack structure for applying a bias to the vertical memory strings is located. The pad stack structure may be connected to the cell stack structure to form a single stack structure. Therefore, the cell region CELL and the contact region CONTACT may be in contact with each other in the II' direction, as illustrated in FIG. 1. The X-decoder region X-DEC may be spaced apart from the contact region in a second direction II-II'. Also, the page buffer PB region may be spaced apart from the cell region CELL in the II-II' direction.

In an embodiment, the peripheral region PERI may be disposed to be spaced apart from the cell region CELL and/or the contact region CONTACT.

According to the layout of FIG. 1, the X-decoder region X-DEC, the contact region CONTACT, the cell region CELL, the contact region CONTACT, and the X-decoder region X-DEC may be sequentially arranged in the first direction I-I' while the cell region CELL and the page buffer region PB may be sequentially arranged in a second direction II-II'.

In addition, a flexible buffer such as an air gap or a flexible structure may be located at the periphery of the cell region CELL, in the area between the cell region CELL and the periphery region PERI. In FIG. 1, reference numeral "FB" designates a region in which the flexible buffer may be located. The flexible buffer is used to reduce stress applied from a layer such as an insulating or a conductive layer to a peripheral device. The stress may be caused by any reason. For example, the stress may be stress due to the weight of the three dimensional structure. The stress may also be due to manufacturing variations and or structural deformation occurring overtime. The stress may be compressive stress and/or tensile stress.

The flexible buffer is used to reduce compressive stress and/or tensile stress applied from a layer having a relatively large volume to a peripheral device. For example, a stacked structure having a large aspect ratio may be located in a cell region and an interlayer insulating layer having substantially the same height as the stacked structure may be formed around the cell region. In this case, the interlayer insulating layer has a larger volume than other neighboring layers, so that compressive stress and/or tensile stress may be applied to the stacked structure from the interlayer insulating layer. However, if the flexible buffer is formed around the stacked structure, the flexible buffer may absorb the stress. Thus, it is possible to prevent the stress from being applied to the stacked structure.

The flexible buffer may flexibly absorb a stress applied thereto. In an embodiment, the flexible buffer may be an air gap. In another embodiment the flexible buffer may be a flexible element. However, the invention is not limited in this way.

As illustrated in FIG. 1, the flexible buffer may be located in the periphery of the cell region CEEL between both the cell region CELL and the X-decoder region X-DEC including in the contact region, and between the page buffer region PB and the cell region CELL. However, the invention is not limited to this configuration only. For example, in an embodiment, the flexible buffer may be located only between the cell region CELL and the X-decoder X-DEC, which are adjacent to each other in the first direction I-I'. In another embodiment, the flexible buffer may be located between the contact region CONTACT and the X-decoder region X-DEC, which are adjacent to each other in the first direction I-I'. In yet another embodiment, which includes a cell region CELL, a contact region CONTACT and a X-decoder region X-DEC arranged sequentially in the I-I' direction as illustrated in FIG. 1, with the contact region CONTACT abutting the cell region CELL, the flexible buffer may be located in the contact region CONTACT and in the region between the contact region CONTACT and the X-decoder region X-DEC.

FIGS. 2A to 2D are layouts illustrating arrangement forms of the flexible buffers according to embodiments of the present disclosure. The flexible buffers may be flexible elements or air gaps. A case where the flexible buffers are air gaps will be described below as an example.

Referring to FIGS. 2A to 2D, air gaps 11 to 14 according to embodiments of the present disclosure are located at the periphery of a cell region CELL, and are arranged to surround the cell region CELL. The respective air gaps 11 to 14 may be arranged in one or more layers. In the embodiments, it is illustrated that each of the air gaps 11 to 14 has three parallel layers.

In the illustrated embodiment, the cell region CELL has a quadrangular shape having first to fourth sides <1> to <4>, and the air gaps 11 to 14 are formed so that each of them surrounds one side among the first to fourth sides <1> to <4>. For example, as illustrated air gap 11 surrounds the first side <1> of the cell region CELL, air gap 12 surrounds the second side <2> of the cell region CELL, third air gap 13 surrounds the third side <3> of the cell region CELL, and fourth air gap 14 surrounds the fourth side <4> of the cell region CELL.

Referring to FIG. 2A, each of the first to fourth air gaps 11 to 14 may have an elongated line shape. For example, the first air gap 11 may extend along the first side <1> of the cell region CELL, the second air gap 12 may extend along the second side <2> of the cell region CELL, the third air gap 13 may extend along the third side <3> of the cell region CELL, and the fourth air gap 14 may extend along the fourth side <4> of the cell region CELL. Each of the first to fourth air gaps 11 to 14, includes three spaced apart gaps extending in parallel along their respective side of the quadrangular cell region CELL.

The first air gaps 11 may be arranged at a predetermined distance along the first side <1> of the cell region CELL, the second air gaps 12 may be arranged at a predetermined distance along the second side <2> of the cell region CELL, the third air gaps 13 may be arranged at a predetermined distance along the third side <3> of the cell region CELL, and the fourth air gaps 14 may be arranged at a predetermined distance along the fourth side <4> of the cell region CELL.

The first to fourth air gaps 11 to 14 may completely surround or partially surround the respective sides <1> to <4> of the cell region CELL. For example, a first length L1 of the first side <1> of the cell region CELL may be equal to a second length L2 of the first air gap 11, as illustrated in the embodiment of FIG. 2A. Alternatively, the second length L2 may be shorter or longer than the first length L1 (not shown).

Figure 2B:
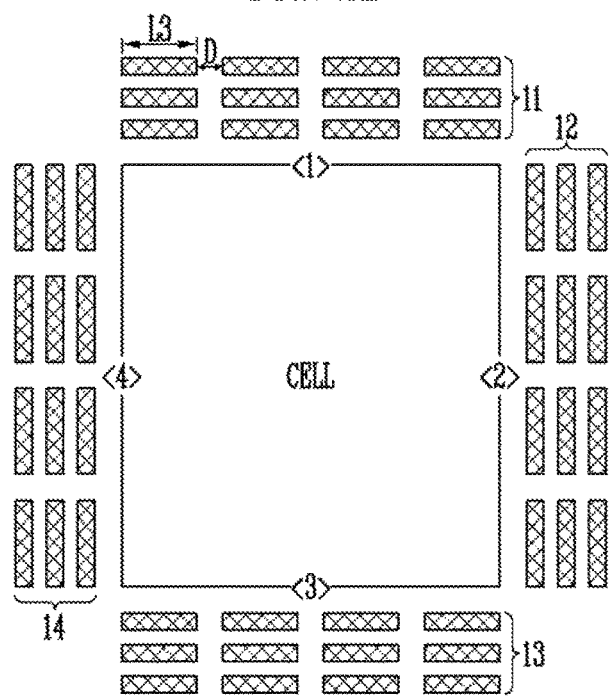

Referring to FIG. 2B, each of the first to fourth air gaps 11 to 14 may have an island shape, wherein each air gap includes a plurality of smaller air gaps. For example, air gap 11 comprises three air gaps arranged in parallel to the first side of the quadrangular cell region CELL, wherein each of the three air gaps is a discontinuous air gap, including four smaller air gaps each having a length 13 and arranged in a line at a regular distance D from one another.

The lengths L3 of the individual smaller air gaps making each of the first to fourth air gaps 11 to 14 may be equal to or different from each other. Also, the distances D inbetween the individual smaller air gaps may be equal to or different from each other. In the embodiment of FIG. 2B, it is illustrated that each of the first to fourth air gaps 11 to 14 has a total of twelve individual smaller air gaps having each the length L3 and arranged in three parallel rows with four air gaps in each row spaced apart at a distance D.

Figure 2C:
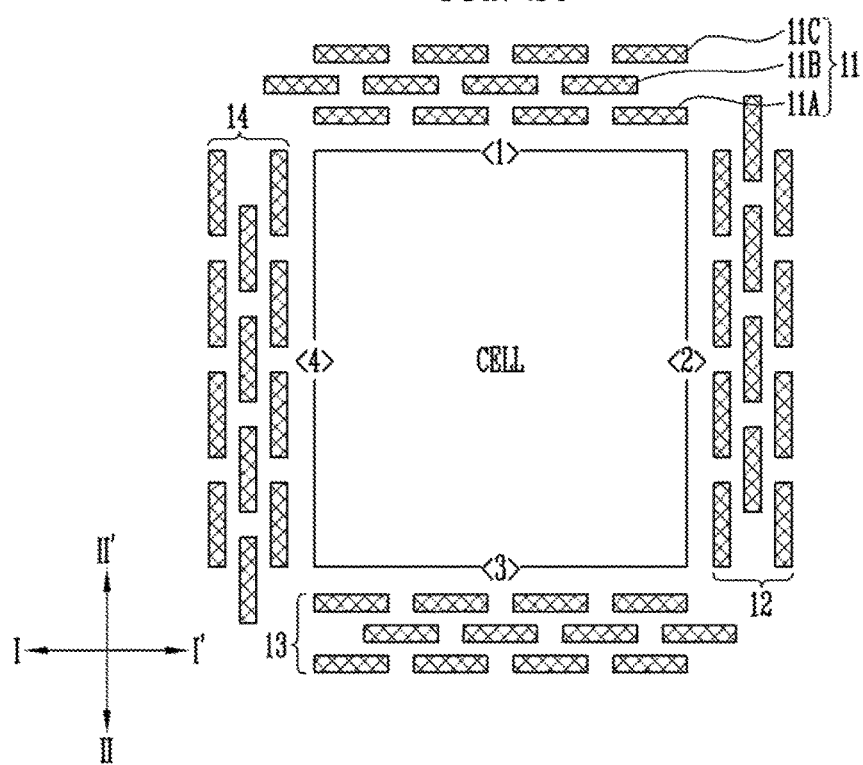

Referring to FIG. 2C, the twelve air gaps making each of the first to fourth air gaps 11 to 14 may be arranged in a zigzag form. For example, the first air gaps 11 surround the first side <1> of the cell region CELL in three layers, first air gaps 11A to 11C of first to third layers may be sequentially arranged in the second direction II-II'. In addition, the first air gaps 11A of the first layer and the first air gaps 11B of the second layer may be arranged to be offset from each other in the first direction I-I', and the first air gaps 11B of the second layer and the first air gaps 11C of the third layer may be arranged to be offset from each other in the first direction I-I'.

Figure 2D:
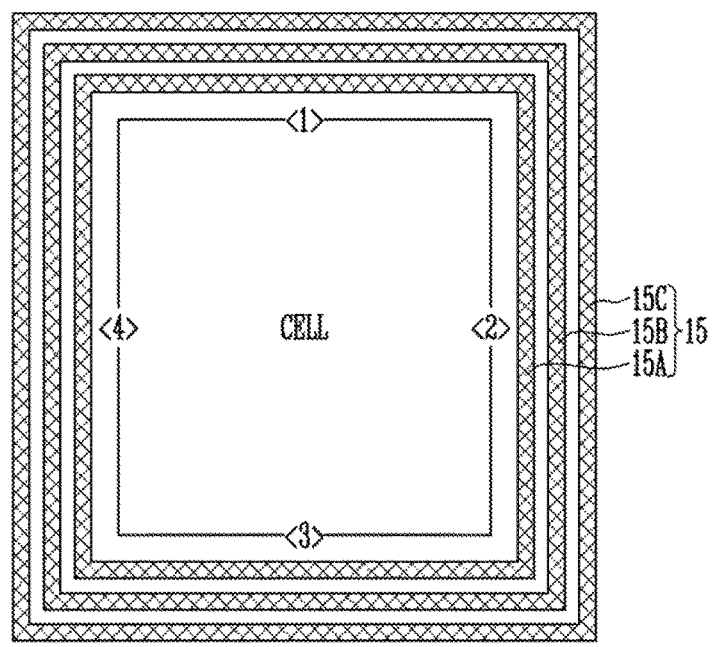

Referring to FIG. 2D, air gaps 15 have a single closed line shape completely surrounding the cell region CELL. In this figure, it is Illustrated that first to third air gaps 15A to 15C of three layers surround the cell region CELL, and the respective first to third air gaps 15A to 15C are single closed lines having quadrangular shapes. However, we note, that in a variation of the embodiment of FIG. 2D, the air gaps 15 may have a different shape, for example, each of the air gaps 15 may be a single circular closed line.

Meanwhile, the above-described shapes of the air gaps 11 to are provided for Illustrative purposes, and the present disclosure is not limited thereto. An arrangement form of air gaps according to an embodiment of the present disclosure may be implemented in a form in which the embodiments described with reference to FIG. 2A are combined or modified.

Figure 4A:
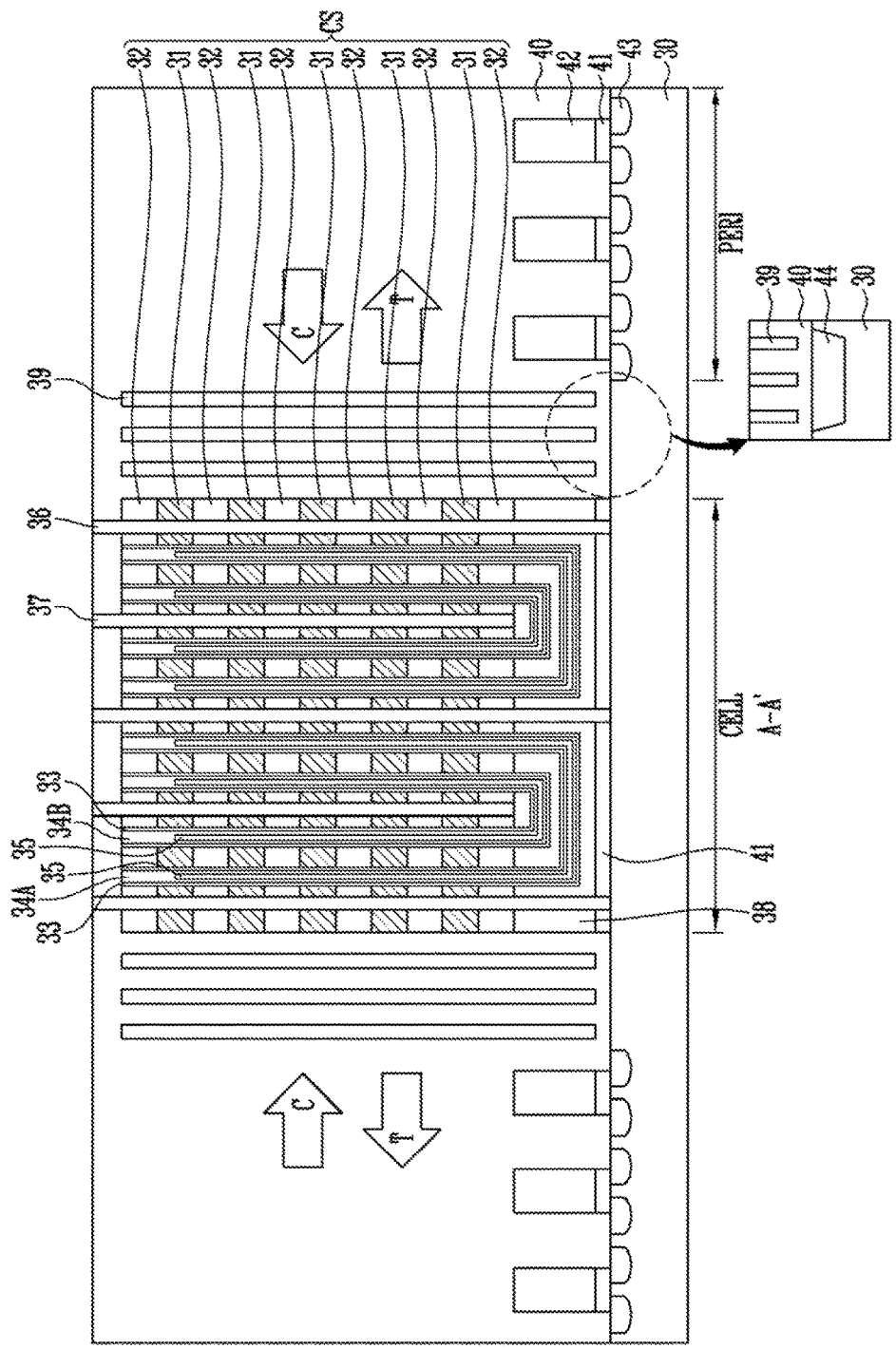
FIGS. 4A to 4D are sectional views of the semiconductor device taken along line A-A' of FIG. 3.
Figure 5A:
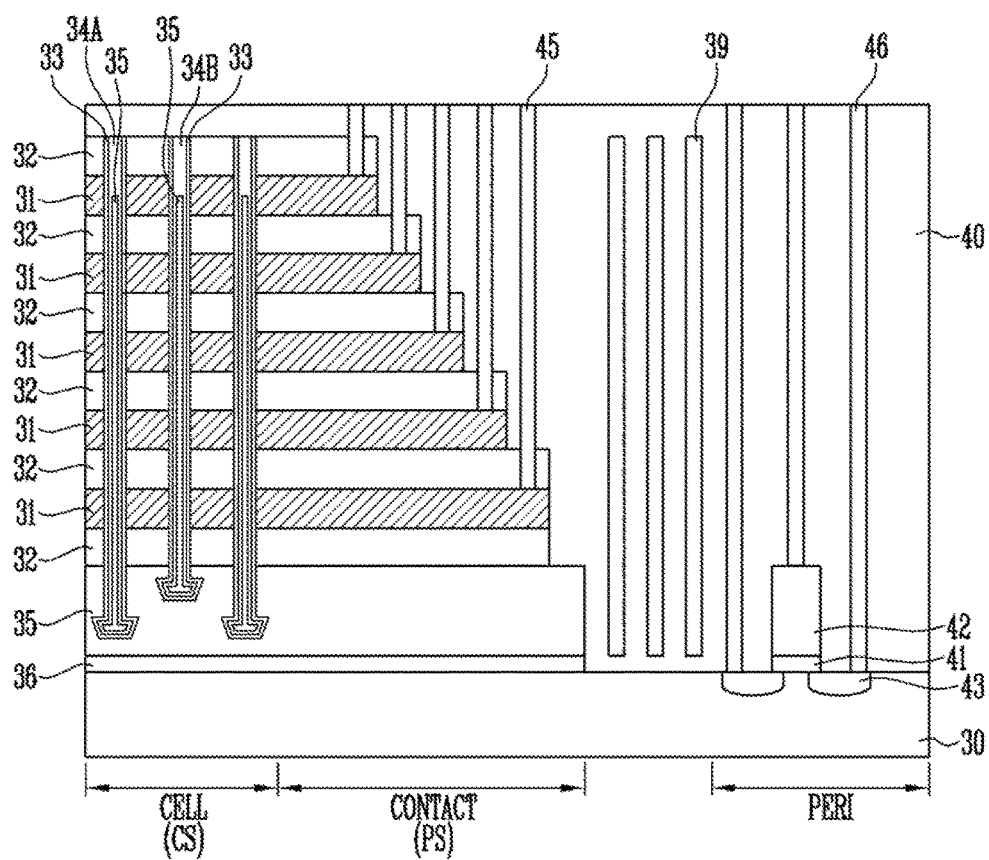
FIGS. 5A and 5B are sectional views of the semiconductor device taken along line B-B' of FIG. 3.

FIG. 3 is a layout of a semiconductor device according to an embodiment of the present disclosure. FIG. 4A is a sectional view taken along line A-A' of FIG. 3, and FIG. 5A is a sectional view taken along line B-B' of FIG. 3.

Referring to FIGS. 3 and 4A, a stack structure is located over a substrate 30. An interlayer insulating layer 40 is formed to cover the stack structure. A height of the stack structure may be greater than a width of its base side. That is, the stack structure may have a large aspect ratio. In addition, the Interlayer insulating layer 40 is formed with a height substantially equal to or higher than that of the stack structure, and the stack structure may be located in the interlayer insulating layer 40. For example, the stack structure may be a cell stack structure CS of a cell region CELL, and the interlayer insulating layer 40 may be formed in the cell region CELL and a peripheral region PERI.

The cell stack structure CS includes vertical memory strings, conductive layers 31 and insulating layers 32, which are alternately stacked, and channel layers 34A and 34B penetrating the conductive layers 31 and the insulating layers 32. A memory layer 33 may be interposed between the conductive layers 31 and each of the channel layers 34A and 34B. A gap-fill Insulating layer 35 may be filled in the channel layers 34A and 34B.

The detailed structure of the cell stack structure may be changed depending on the particular arrangement of the memory strings. In FIG. 4A, it is illustrated that vertical memory strings are arranged in a U-shape including at least two vertical memory strings vertically disposed, wherein each memory string includes at least one drain select transistor, a plurality of drain-side memory cells, at least one pipe transistor, a plurality of source-side memory cells, and at least one source select transistor, which are connected in series. This structure will be described in more detail below. The cell stack structure CS includes a gate Insulating layer 41, a pipe gate 38, and the alternately stacked conducive layers 31 and insulating layers 32, which are sequentially stacked on the substrate 30. At least one uppermost conductive layer 31 may be a drain select line or source select line, and the other conductive layers 31 may be word lines. The conductive layers 31 may Include tungsten (W), tungsten nitride ($WN_x$), etc., and the insulating layers 32 may include oxide.

A first channel layer 34A and a second channel layer 34B have a structure in which they are vertically located so that the former is disposed over the latter. Each of the channel layers 34A and 34B may include a pipe channel layer in the pipe gate 38; and a source-side channel layer and a drain-side channel layer, which penetrate the conductive layers 31 and the insulating layers 32. Each of the respective channel layers 34A and 34B includes a pipe channel layer and source-side and drain-side channel layers connected to the pipe channel layer.

A first slit insulating layer 36 penetrating the alternately stacked conductive layers 31 and insulating layers 32 and the pipe gate 38 may be located between adjacent first channel layers 34A. Also, a second slit insulating layer 37 may be located between the source-side and drain-side channel layers of the second channel layer 34B. The first slit insulating layer 36 may be used to Isolate adjacent memory blocks from each other, and the second slit insulating layer 37 may be used to isolate a source-side word/select lines and drain-side word/select lines from each other.

A transistor may be located in the peripheral region PERI. The transistor includes the gate insulating layer 41 and a gate electrode 42 on the substrate 30. A junction 43 may be located in the substrate 30 at both sides of the gate electrode 42.

The cell region CELL and the peripheral region PERI are disposed to be spaced apart from each other at a predetermined distance, and the flexible buffers are located between the cell region CELL and the peripheral region PERI. The flexible buffers may be regions filled with air in the interlayer insulating layer 40. That is, the flexible buffer may be air gaps 39.

The air gaps 39 may be located to surround the cell stack structure CS, and may extend in the stacking direction of the cell stack structure CS. Therefore, the air gaps 39 may have a height substantially equal to or higher than that of the cell stack structure CS.

The substrate 30 may include an isolation layer 44 located in a device isolation region. An active region is defined by the isolation layer 44. Therefore, the air gaps 39 may be located on the isolation layer 44 or may be located on the active region.

According to the structure described above, the cell stack structure CS having a large aspect ratio is located in the cell region CELL and the transistor is located in the peripheral region PERI. Hence, a step difference between the cell region CELL and the peripheral region PERI is large. Therefore, the interlayer insulating layer 40 having a large volume is formed in the peripheral region PERI, and compressive stress C and tensile stress T, which applied from the interlayer insulating layer 40 to the cell stack structure CS, are increased. As a result, the cell stack structure CS may be subjected to excessive stress.

However, according to an embodiment of the present disclosure, the air gaps 39 are located at the periphery of the cell region CELL for absorbing this stress. Particularly, the air gaps 39 may be located between the cell region CELL and the peripheral region PERI. The structure of the air gaps 39 is flexibly modified when pressure is applied to the air gaps 39 from their surroundings. Thus, the air gaps 39 can buffer any stress including a compressive stress C and a tensile stress T, generated by the interlayer insulating layer 40 having a large volume and transferred the stress to the cell stack structure CS. Particularly, the air gaps 39 are arranged to surround the cell stack structure CS in several layers, so that it is possible to more effectively buffer the compressive stress C and the tensile stress T.

Figure 4B:
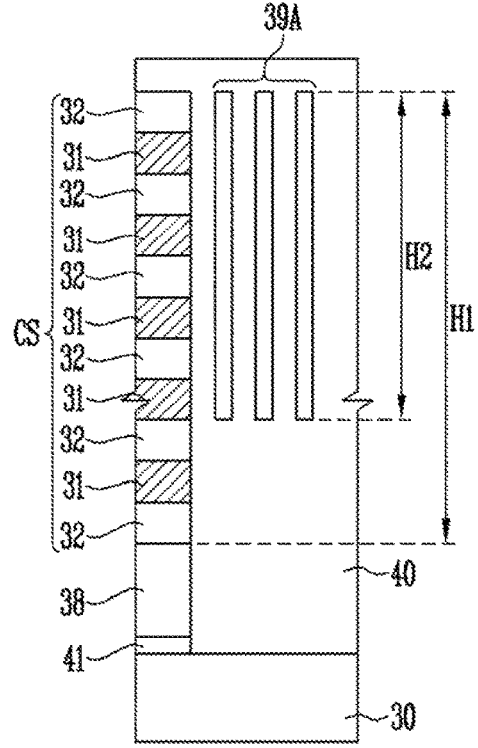
Figure 4C:
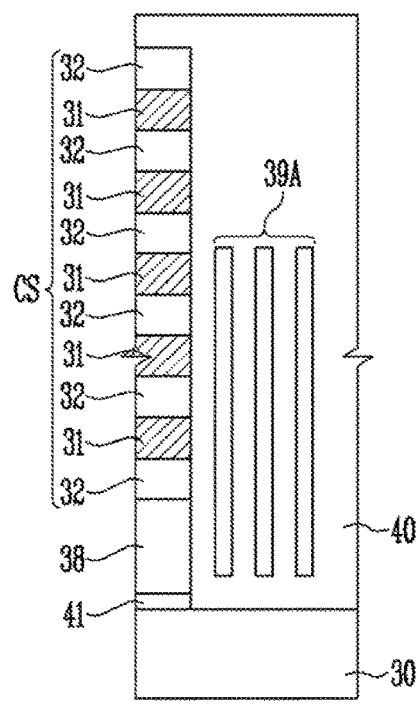
Figure 4D:
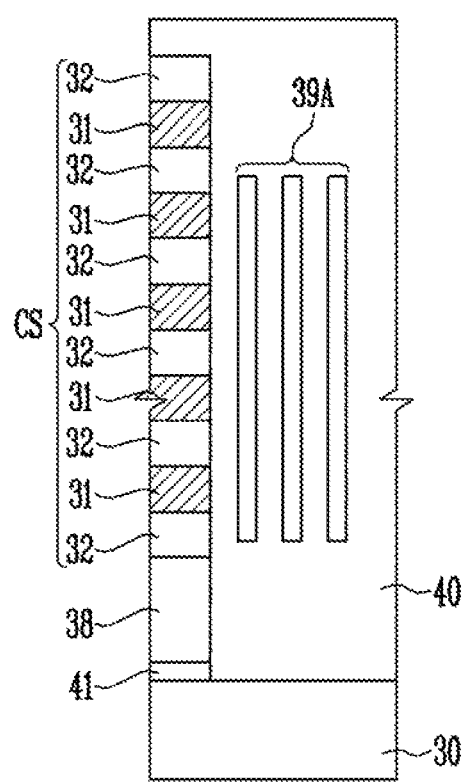

FIGS. 4B to 4D illustrate an example in which the arrangement of the flexible buffers is modified. A region of FIG. 4A in which air gaps are formed is enlarged. Referring to FIGS. 4B to 4D, air gaps 39A to 39C may extend in the stacking direction of the cell stack structure CS and may partially overlap with the cell stack structure CS.

The compressive stress C and the tensile structure T, which are applied to the cell structure CS, may be changed depending on various factors such as a volume of the interlayer insulating layer 40, a step difference between the cell region CELL and the peripheral region PERI, a shape of the cell stack structure CS, a height H1 of the cell stack structure CS, and an aspect ratio of the cell stack structure CS. Thus, the air gaps 39A to 39C can be efficiently disposed to overlap along a partial height H2 of the cell stack structure CS at a position, at which the compressive stress C and the tensile stress T are concentrated, through simulation of a distribution of the compressive stress C and the tensile stress T, which are applied to the cell stack structure CS. For example, when the compressive stress C and the tensile stress T are concentrated on an upper portion of the cell stack structure CS, air gaps 39A may be located to overlap with the upper portion of the cell stack structure CS (see FIG. 4B). When the compressive stress C and the tensile stress T are concentrated on a lower portion of the cell stack structure CS, air gaps 39B may be located to overlap with the lower portion of the cell stack structure CS (see FIG. 4C). When the compressive stress C and the tensile stress T are concentrated on a middle portion of the cell stack structure CS, air gaps 39C may be located to overlap with the middle portion of the cell stack structure CS (see FIG. 4D).

We note that the shape of the air gaps 39A to 39C described above is merely an example, and the present disclosure is not limited thereto. Other suitable shapes may be employed. Also, the arrangement of the air gaps may be implemented in a form in which the embodiments described with reference to FIGS. 4B to 4D are combined or modified.

Referring to FIGS. 3 and 5A, the cell stack structure CS is located in the cell region CELL. A pad stack structure PS is located in a contact region CONTACT. The cell stack structure CS and the pad stack structure PS may be connected to be a single stack structure. For example, the single stack structure includes the alternately stacked conductive layers 31 and insulating layers 32, the conductive layers 31 of the cell region CELL serves as word lines, and the conductive layers 31 of the contact region CONTACT serves as pads. Particularly, the pad stack structure PS may have the shape of steps to expose the respective pads. In addition, first contact plugs 45 are connected to the pads, respectively.

The transistor is located in the peripheral region PERI, and second contact plugs 46 may be connected to each of the gate electrode 42 and junction 43 of the transistor. The interlayer insulating layer 40 is formed on the substrate 30 to cover the cell stack structure CS, the pad stack structure PS, and the transistor, and the air gaps 39 may be formed in the interlayer insulating layer 40 between the peripheral region PERI and the cell region CELL. In addition, the isolation layer 44 may be located in the substrate 30, and the isolation layer 44 and the air gaps 39 may overlap with each other in the stacking structure of the cell stack structure CS (see FIG. 4A).

Figure 5B:
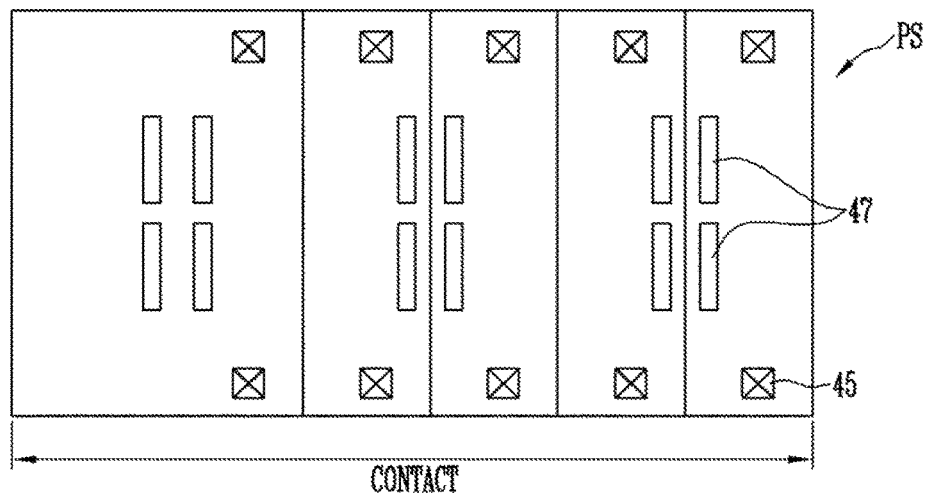

FIG. 5B is an enlarged layout illustrating the contact region CONTACT of FIG. 5A, which shows an arrangement of air gaps 47 located in the contact region CONTACT. The air gaps 47 may be located between the first contact plugs 45. For example, the air gaps 47 are located in each of the steps, and at least one air gap 47 may be located in one step. Also, the air gaps 47 are located at an upper portion of the pad stack structure PS, and may have a depth so that the air gaps 47 penetrate the interlayer insulating layer 40 in the stacking direction but do not penetrate the pad stack structure PS. Alternatively, the air gaps 47 may be formed with a depth so that the air gaps 47 penetrate the pad stack structure PS.

The arrangement of the layout of the air gaps 47 may be variously changed. For example, the air gaps 47 may be located at a boundary between vertically adjacent steps or may be arranged in a zigzag form.

Various embodiments of air gaps for buffering stress applied to the cell stack structure have been illustrated in the above-described embodiments. However, these embodiments are merely provided for convenience of illustration, and the present disclosure is not limited thereto. The present disclosure may be applied to a region in which compressive stress and/or tensile stress are/is applied to a peripheral device by a layer having a large volume in the semiconductor device. For example, the present disclosure may be applied to a region between isolation layers, a region between metal lines, a passivation region, a package, and the like.

Figure 6A:
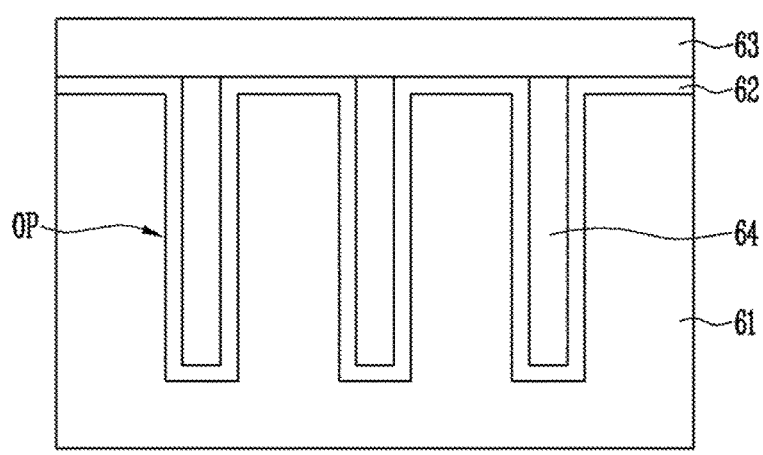
FIGS. 6A to 6C are sectional views illustrating a manufacturing method of a semiconductor device, according to an embodiment of the present disclosure.
Figure 6B:
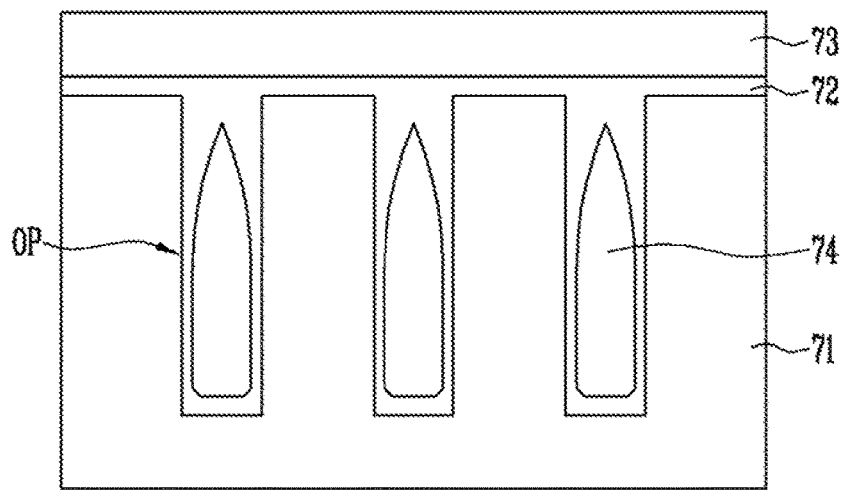
Figure 6C:
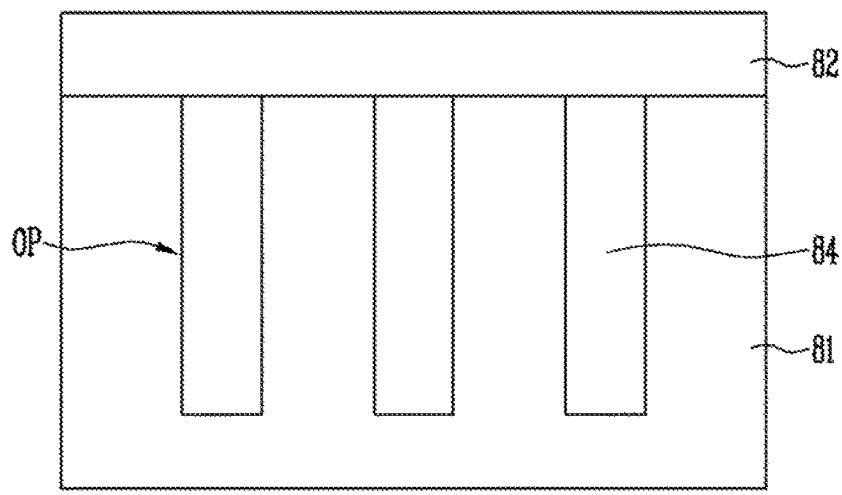

FIGS. 6A to 6C are sectional views illustrating a manufacturing method of a semiconductor device, according to an embodiment of the present disclosure. Hereinafter, a method of forming an air gap as an example of a flexible buffer will be described.

As described above with reference to FIG. 4A, the cell stack structure CS is formed in the cell region CELL of the substrate 30, and the transistor is formed in the peripheral region PERI of the substrate 30. Subsequently, the interlayer insulating layer 40 covering the cell stack structure CS and the transistor is formed on the substrate 30. Subsequently, at least one air gap 39 located between the cell region CELL and the peripheral region PERI is formed in the interlayer insulating layer 40. Hereinafter, a method of forming the air gap 39 in the interlayer insulating layer 40 will be mainly described. In FIGS. 6A to 6C, for convenience of illustration, lower structures such as the cell stack structure CS, the pad stack structure PS, and a transistor are omitted, and only an interlayer insulating layer and air gaps are illustrated.

Referring to FIG. 6A, openings OP are formed in an interlayer insulating layer 61. The openings OP are used to form air gaps 64, and may be formed with a larger size than the finally formed air gaps 64. The depth, width, and arrangement of the openings OP may be determined with reference to the above-described embodiments.

Subsequently, a first insulating layer 62 is formed along inner surfaces of the openings OP. The first insulating layer 62 is used to adjust the size of the air gap 64, and may be formed by depositing an insulating material using a process having relatively excellent step coverage. For example, the first insulating layer 62 may be formed using a low pressure chemical vapor deposition (LPCVD) process.

Subsequently, a second insulating layer 63 is formed on the first insulating layer 62. The second insulating layer 63 seals the tops of the openings OP, thereby forming the air gaps 64. The second insulating layer 63 may be formed by depositing an insulating material using a process having relatively poor step coverage. For example, the second insulating layer 63 may be formed using a plasma enhanced chemical vapor deposition (PECVD) process.

According to the method described above, after the openings OP are formed using a lithography process, the size of the openings OP can be decreased using the first insulating layer 62. Thus, it is possible to easily form the openings OP having a narrower width than a resolution limit of the lithography process.

Referring to FIG. 6B, openings OP are formed in an interlayer insulating layer 71, and then first and second insulating layers 72 and 73 are sequentially formed. The first insulating layer 72 is formed along inner surfaces of the openings OP, and seals the tops of the openings OP. Thus, air gaps 74 having a smaller size than the openings OP can be formed. According to the above-described method, the size of the air gaps 74 can be adjusted by controlling deposition conditions (e.g., a deposition time, a gas flow rate, and the like) of the first insulating layer 72. In addition, the forming of the second insulating layer 73 may be omitted.

Referring to FIG. 6C, openings OP are formed in the interlayer insulating layer 81, and a first insulating layer 82 is then formed. In this case, the first insulating layer 82 may be formed by depositing an insulating material using a process having relatively poor step coverage. Accordingly, air gaps 84 are formed by the first insulating layer 82 located on the interlayer insulating layer 81 and sealing the tops of the openings OP.

According to the methods described above, the air gaps 64 to 84 can be easily formed in the interlayer insulating layers 61 to 81, respectively, and the sizes of the air gaps 64 to 84 can be easily adjusted.

Figure 7:
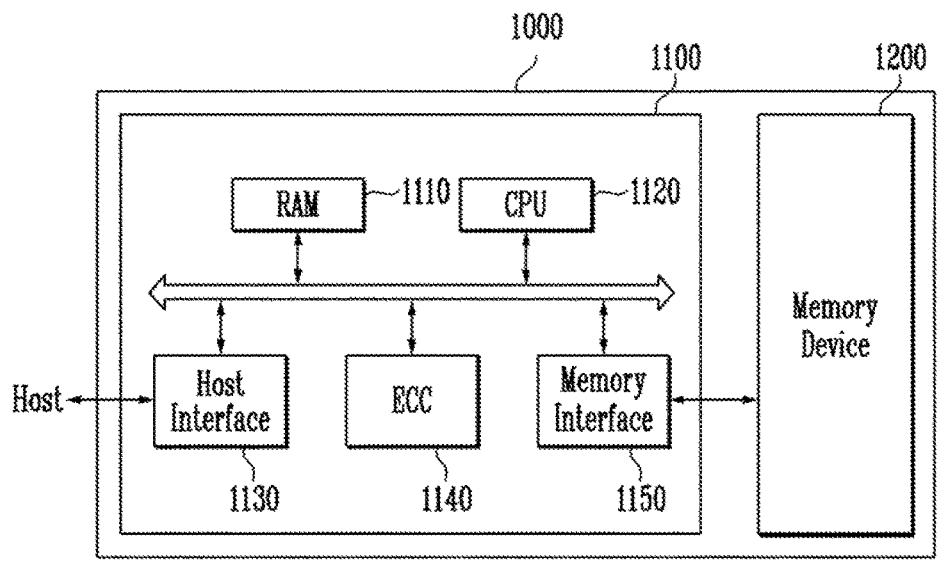
FIGS. 7 and 8 are block diagrams illustrating configurations of memory systems, according to embodiments of the present disclosure.

FIG. 7 is a block diagram Illustrating a configuration of a memory system, according to an embodiment of the present disclosure.

Referring to FIG. 7, the memory system 1000 according to the embodiment of the present disclosure includes a memory device 1200 and a controller 1100.

The memory device 1200 is used to store data information having various data formats such as, for example, texts, graphics, and software codes. The memory device 1200 may be a nonvolatile memory, and may include any of the structures described with reference to FIGS. 1 to 6C. The memory device 1200 is configured to include: a substrate including a cell region and a peripheral region adjacent to the cell region; a cell stack structure located in the cell region of the substrate, the cell stack structure Including vertical memory strings; a circuit located in the peripheral region of the substrate, the circuit driving the vertical memory strings; and an interlayer insulating layer formed on the substrate to cover the cell stack structure and the circuit, the interlayer insulating layer including air gaps located between the cell region and the peripheral region. The structure and manufacturing method of the memory device 1200 are the same as described above, and therefore, their detailed descriptions will be omitted.

The controller 1100 is connected to a host and the memory device 1200 and configured to access the memory device 1200 in response to a request from the host. For example, the controller 1100 may be configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control overall operations of the controller 1100. For example, the CPU 1120 may be configured to operate firmware such as a flash translation layer (FTL) stored in the RAM 1110.

The host interface 1130 is configured to interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further Include a ROM that stores code data for interfacing with the host.

As described above, the memory system 1000 according to the embodiment of the present disclosure includes the memory device 1200 having improved structural stability and manufacturing yield, and thus it is possible to improve the structural stability and manufacturing yield of the memory system 1000.

Figure 8:
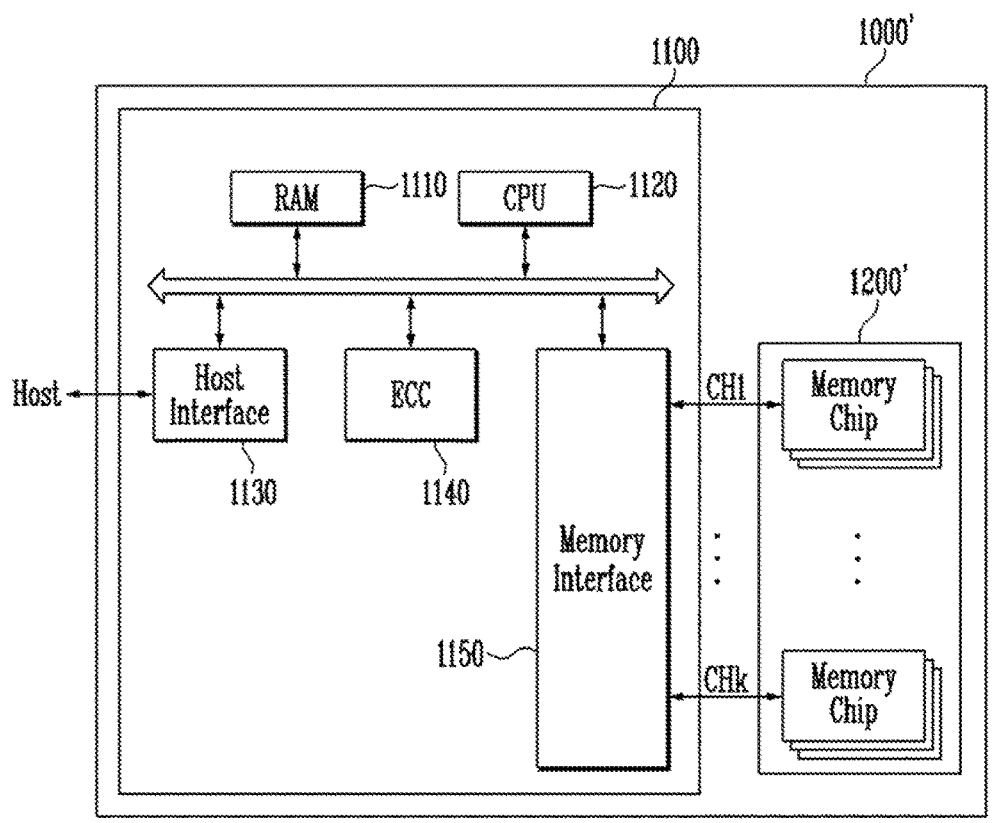

FIG. 8 is a block diagram illustrating a configuration of a memory system, according to an embodiment of the present disclosure. Hereinafter, description of contents overlapping with those described above will be omitted.

As shown in FIG. 8, the memory system 1000' according to the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory, and may include the structures described with reference to FIGS. 1 to 6C. The memory device 1200' is configured to include: a substrate including a cell region and a peripheral region adjacent to the cell region; a cell stack structure located in the cell region of the substrate, the cell stack structure including vertical memory strings; a circuit located in the peripheral region of the substrate, the circuit driving the vertical memory strings; and an interlayer insulating layer formed on the substrate to cover the cell stack structure and the circuit, the Interlayer insulating layer including air gaps located between the cell region and the peripheral region. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' includes the memory device 1200' having improved structural stability and manufacturing yield, and thus it is possible to improve the structural stability and manufacturing yield of the memory system 1000'. Particularly, the memory device 1200' is configured as a multi-chip package, so that it is possible to increase the data storage capacity of the memory system 1000' and to improve the operation speed of the memory system 1000'.

Figure 9:
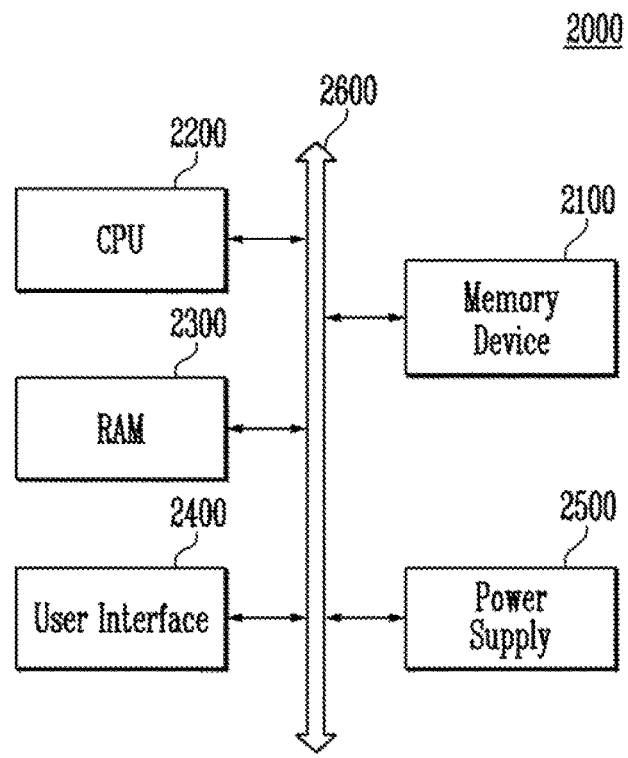
FIGS. 9 and 10 are block diagrams illustrating computing systems, according to embodiments of the present disclosure.

FIG. 9 is a block diagram illustrating a configuration of a computing system, according to an embodiment of the present disclosure. Hereinafter, description of contents overlapping with those described above will be omitted.

According to the embodiment of FIG. 9, the computing system 2000 includes a memory device 2100, a CPU 2200, a RAM 2300, a user interface 2400, a power source 2500, and a system bus 2600.

The memory device 2100 stores data provided through the user Interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, and or the RAM 2300.

The memory device 2100 may be a nonvolatile memory, and may include any of the structures described with reference to FIGS. 1 to 6C. In addition, the memory device 2100 is configured to include: a substrate including a cell region and a peripheral region adjacent to the cell region; a cell stack structure located in the cell region of the substrate, the cell stack structure including vertical memory strings; a circuit located in the peripheral region of the substrate, the circuit driving the vertical memory strings; and an interlayer insulating layer formed on the substrate to cover the cell stack structure and the circuit, the interlayer insulating layer including air gaps located between the cell region and the peripheral region. The structure and manufacturing method of the memory device 2100 are the same as described above, and therefore, their detailed descriptions will be omitted.

The memory device 2100 may be a multi-chip package including a plurality of memory chips as described with reference to FIG. 8.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, and the like.

As described above, the computing system 2000 includes the memory device 2100 having improved structural stability and manufacturing yield, and thus it is possible to improve the structural stability and manufacturing yield of the computing system 2000.

Figure 10:
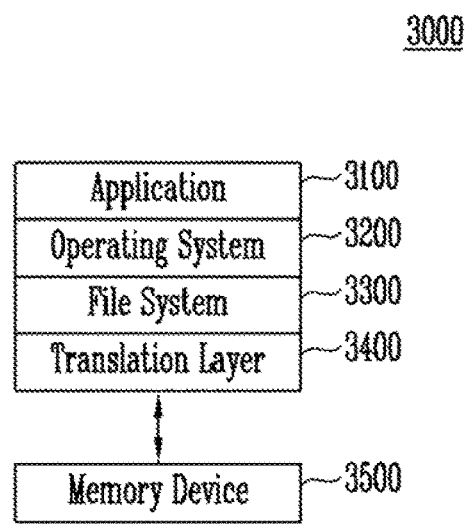

FIG. 10 is a block diagram illustrating a computing system, according to an embodiment of the present disclosure.

According to the embodiment shown in FIG. 10, the computing system 3000 includes a software layer including an operating system 3200, an application 3100, a file system 3300, a translation layer 3400, and the like. In addition, the computing system 3000 may include a hardware layer of a memory device 3500.

The operating system 3200 may manage software resources, hardware resources, and the like of the computing system 3000, and control program execution of a central processing unit. The application 3100 is one of a variety of application programs running on the computing system 3000, and may be a utility executed by the operating system 3200.

The file system 3300 may be or include a logical structure for managing data, files, etc. in the computing system 3000, and may organize the data or flies stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In the illustrated embodiment of FIG. 10, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory, and may Include the structures described with reference to FIGS. 1 to 6C. In addition, the memory device 3500 is configured to include: a substrate including a cell region and a peripheral region adjacent to the cell region; a cell stack structure located in the cell region of the substrate, the cell stack structure including vertical memory strings; a circuit located in the peripheral region of the substrate, the circuit driving the vertical memory strings; and an interlayer insulating layer formed on the substrate to cover the cell stack structure and the circuit, the Interlayer insulating layer including air gaps located between the cell region and the peripheral region. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 includes the memory device 3500 having improved structural stability and manufacturing yield, and thus it is possible to improve the structural stability and manufacturing yield of the computing system 3000.

According to the present disclosure, flexible buffers are formed at the periphery of a cell stack structure having a large aspect ratio, for reducing compressive stress and/or tensile stress, applied to the cell stack structure. For example, an interlayer insulating layer may include air gaps located between the cell region and the peripheral region, with the air gaps arranged along sidewalls of the cell stack structure. The air gaps can buffer compressive stress and/or tensile stress, applied to the cell stack structure from the interlayer insulating layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a substrate including a cell region and a peripheral region adjacent to the cell region;
a cell stack structure located in the cell region, and including memory strings;
a circuit located in the peripheral region; and
an interlayer insulating layer formed on the substrate to cover the cell stack structure and the circuit, and including air gaps located between the cell region and the peripheral region,
wherein the air gaps include:
first air gaps having an island shape and arranged along a first direction;
second air gaps having an island shape and arranged along the first direction, and
wherein the second air gaps are next to the first air gaps in a second direction crossing the first direction, and are arranged to be offset from the first air gaps in the first direction.

2. The semiconductor device of claim 1,
wherein the cell region has a quadrangular shape having first to fourth sides, and
wherein the air gaps include at least one of third to sixth air gaps, wherein the third air gap extends along the first side of the cell region in that the first direction, the fourth air gap extends along the second side of the cell region in a second direction crossing the first direction, the fifth air gap extends along the third side of the cell region in the first direction, and the sixth air gap extends along the fourth side of the cell region in the second direction.

3. The semiconductor device of claim 1,
wherein the cell region has a quadrangular shape having first to fourth sides, and
wherein the first air gaps are arranged along the first side of the cell region and extend in the first direction, and the second air gaps are arranged along the third side of the cell region in the first direction.

4. The semiconductor device of claim 1,
wherein the cell region has a quadrangular shape having first to fourth sides, and
wherein the air gaps include at least one third air gap having a closed loop shape surrounding the first to fourth sides of the cell region.

5. The semiconductor device of claim 1,
wherein the cell region has a quadrangular shape having first to fourth sides, and
wherein the air gaps surround the first to fourth sides of the cell region.

6. The semiconductor device of claim 1, further comprising:
isolation layers formed in the substrate between the cell region and the peripheral region,
wherein the air gaps are located over the isolation layers to overlap with the isolation layers in the stacking direction of the cell stack structure.

7. The semiconductor device of claim 1, wherein the air gaps extend in the stacking direction of the cell stack structure, and have a height substantially equal to or higher than that of the cell stack structure.

8. The semiconductor device of claim 1, wherein the air gaps extend in the stacking direction of the cell stack structure, and have a height less than that of the cell stack structure.

9. The semiconductor device of claim 1, further comprising:
a pad stack structure formed on a contact region of the substrate, wherein the contact region is located between the cell region and the peripheral region; and
contact plugs connected to the pad structure, wherein a bias is applied to the vertical memory strings through the contact plugs.

10. A semiconductor device, comprising:
a substrate including a cell region and a peripheral region adjacent to the cell region;
a cell stack structure located in the cell region, and including memory strings;
a circuit located in the peripheral region; and
an interlayer insulating layer formed on the substrate to cover the cell stack structure and the circuit, and including air gaps;
a pad stack structure formed on a contact region of the substrate, wherein the contact region is located between the cell region and the peripheral region; and
contact plugs connected to the pad structure,
wherein the air gap is located in the contact region between the contact plugs.

11. The semiconductor device of claim 1,
wherein the pad stack structure has the shape of steps, and
wherein each of the air gaps is located in each of the steps of the pad stack structure.

12. The semiconductor device of claim 1, wherein the circuit is an X-decoder.

13. The semiconductor device of claim 1, wherein the circuit is a page buffer.

14. A semiconductor device comprising:
a substrate;
a stack structure formed over the substrate;
an interlayer insulating layer formed on the substrate to cover the stack structure; and
flexible buffers located at the periphery of the stack structure, and formed in the interlayer insulating layer to buffer stress applied to the stack structure from the interlayer insulating layer,
wherein the flexible buffers have an island shape and are arranged along a sidewall of the stack structure so that the flexible buffers are spaced apart from each other.

15. The semiconductor device of claim 14, wherein a shape of each of the flexible buffers is modified by the stress.

16. The semiconductor device of claim 14, wherein each of the flexible buffers is an air gap.

17. The semiconductor device of claim 14, wherein each of the flexible buffers has a height substantially equal to or higher than that of the stack structure.

18. The semiconductor device of claim 1, wherein at least two layers of the air gaps surround the cell structure.

* * * * *